United States Patent
Wu et al.

(10) Patent No.: US 9,330,989 B2
(45) Date of Patent: May 3, 2016

(54) SYSTEM AND METHOD FOR CHEMICAL-MECHANICAL PLANARIZATION OF A METAL LAYER

(71) Applicant: TAIWAN SEMICONDUCTOR MANUFACTURING COMPANY, LTD., Hsin-Chu (TW)

(72) Inventors: Yung-Hsu Wu, Taipei (TW); Shih-Kang Fu, Zhongli (TW); Hsin-Chieh Yao, Douliu (TW); Hsiang-Huan Lee, Jhudong Township, Hsinchu County (TW); Chung-Ju Lee, Hsinchu (TW); Hai-Ching Chen, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 13/631,684

(22) Filed: Sep. 28, 2012

(65) Prior Publication Data
US 2014/0091477 A1 Apr. 3, 2014

(51) Int. Cl.
| H01L 21/4763 | (2006.01) |
| H01L 21/66 | (2006.01) |
| H01L 21/311 | (2006.01) |
| H01L 21/321 | (2006.01) |
| H01L 21/768 | (2006.01) |

(52) U.S. Cl.
CPC .......... *H01L 22/26* (2013.01); *H01L 21/31144* (2013.01); *H01L 21/3212* (2013.01); *H01L 21/7684* (2013.01); *H01L 21/76835* (2013.01); *H01L 22/14* (2013.01)

(58) Field of Classification Search
CPC ............... H01L 21/02203; H01L 21/3212; H01L 21/76807; H01L 22/26; H01L 21/02126
USPC .......................................... 257/774; 438/637
See application file for complete search history.

(56) References Cited

U.S. PATENT DOCUMENTS

| 5,674,784 A | 10/1997 | Jang et al. |
| 6,159,786 A | 12/2000 | Chiang et al. |
| 6,255,211 B1 | 7/2001 | Olsen et al. |
| 6,358,832 B1 | 3/2002 | Edelstein et al. |

(Continued)

OTHER PUBLICATIONS

E. Todd Ryan et al., "Property modifications of nanoporous pSiCOH dielectrics to enhance resistance to plasma-induced damage," Nov. 2008, Journal of Applied Physics 104, Full Article.

(Continued)

*Primary Examiner* — David Vu
*Assistant Examiner* — Brandon Fox
(74) *Attorney, Agent, or Firm* — Haynes and Boone, LLP

(57) ABSTRACT

A method for forming a field-effect transistor with a raised drain structure is disclosed. The method includes depositing a low-k inter-metal layer over a semiconductor substrate, depositing a porogen-containing low-k layer over the low-k inter-metal layer, and etching a space for the via through the low-k inter-metal layer and the porogen-containing low-k layer. The method further includes depositing a metal layer, a portion of the metal layer filling the space for the via, another portion of the metal layer being over the porogen-containing low-layer, removing the portion of the metal layer over the porogen-containing layer by a CMP process, and curing the porogen-containing low-k layer to form a cured low-k layer.

20 Claims, 6 Drawing Sheets

(56) References Cited

U.S. PATENT DOCUMENTS

| | | | |
|---|---|---|---|
| 6,368,955 B1 | 4/2002 | Easter et al. | |
| 6,528,409 B1 | 3/2003 | Lopatin et al. | |
| 6,583,048 B1 | 6/2003 | Vincent et al. | |
| 6,592,764 B1 | 7/2003 | Stucky et al. | |
| 6,710,450 B2 | 3/2004 | Gates et al. | |
| 6,780,517 B2 | 8/2004 | Chen et al. | |
| 6,783,862 B2 | 8/2004 | Hedrick et al. | |
| 6,787,453 B2 | 9/2004 | Abell | |
| 6,846,515 B2 | 1/2005 | Vrtis et al. | |
| 6,878,615 B2 | 4/2005 | Tsai et al. | |
| 6,962,869 B1 * | 11/2005 | Bao | H01L 21/3105 257/E21.576 |
| 7,023,093 B2 | 4/2006 | Canaperi et al. | |
| 7,057,287 B2 | 6/2006 | Kumar et al. | |
| 7,071,539 B2 | 7/2006 | Nicholson et al. | |
| 7,094,713 B1 | 8/2006 | Niu et al. | |
| 7,115,995 B2 | 10/2006 | Wong | |
| 7,125,793 B2 | 10/2006 | Liou et al. | |
| 7,176,245 B2 | 2/2007 | Stucky et al. | |
| 7,217,648 B2 | 5/2007 | Lu et al. | |
| 7,224,064 B2 | 5/2007 | Yoshie | |
| 7,262,142 B2 | 8/2007 | Nakata et al. | |
| 7,265,061 B1 | 9/2007 | Cho et al. | |
| 7,482,265 B2 | 1/2009 | Chen et al. | |
| 7,602,038 B2 | 10/2009 | Zhu | |
| 7,622,399 B2 | 11/2009 | Reid et al. | |
| 7,626,245 B2 | 12/2009 | Tsai et al. | |
| 7,714,572 B2 * | 5/2010 | Tada et al. | 324/230 |
| 7,723,226 B2 | 5/2010 | Yu et al. | |
| 7,915,181 B2 | 3/2011 | Fan et al. | |
| 7,932,188 B2 | 4/2011 | Lukas et al. | |
| 7,955,968 B2 | 6/2011 | Leung et al. | |
| 7,968,451 B2 | 6/2011 | Ko et al. | |
| 8,212,330 B2 | 7/2012 | Chen et al. | |
| 8,298,965 B2 | 10/2012 | McAndrew et al. | |
| 8,405,192 B2 | 3/2013 | Huang et al. | |
| 2003/0098766 A1 * | 5/2003 | Girardie et al. | 336/200 |
| 2004/0084774 A1 | 5/2004 | Li et al. | |
| 2004/0130027 A1 | 7/2004 | Chen et al. | |
| 2004/0130032 A1 | 7/2004 | Gronbeck et al. | |
| 2005/0020702 A1 | 1/2005 | Li et al. | |
| 2005/0178741 A1 | 8/2005 | Yeoh | |
| 2006/0069171 A1 * | 3/2006 | Prokopowicz et al. | 521/61 |
| 2007/0200235 A1 | 8/2007 | Ohkura | |
| 2007/0263322 A1 * | 11/2007 | Huang et al. | 360/126 |
| 2007/0296064 A1 | 12/2007 | Gates et al. | |
| 2008/0188074 A1 | 8/2008 | Chen et al. | |
| 2010/0102452 A1 * | 4/2010 | Nakao | 257/773 |
| 2012/0205814 A1 * | 8/2012 | Wu | H01L 21/02203 257/774 |
| 2013/0171829 A1 * | 7/2013 | Fitzsimmons et al. | 438/712 |

OTHER PUBLICATIONS

Sanjeev Jain, Vladimir Zubkov et al., "Porous low-k dielectrics using ultraviolet curing," Sep. 2005, Solid State Technology vol. 48, Issue 9, Full Article.

Kastenmeier, Bernd et al., "Porous low-k materials and effective k. (Research and Development)." Jul. 2004, Semiconductor International. Reed Business Information, Inc. (US). Full Article.

* cited by examiner

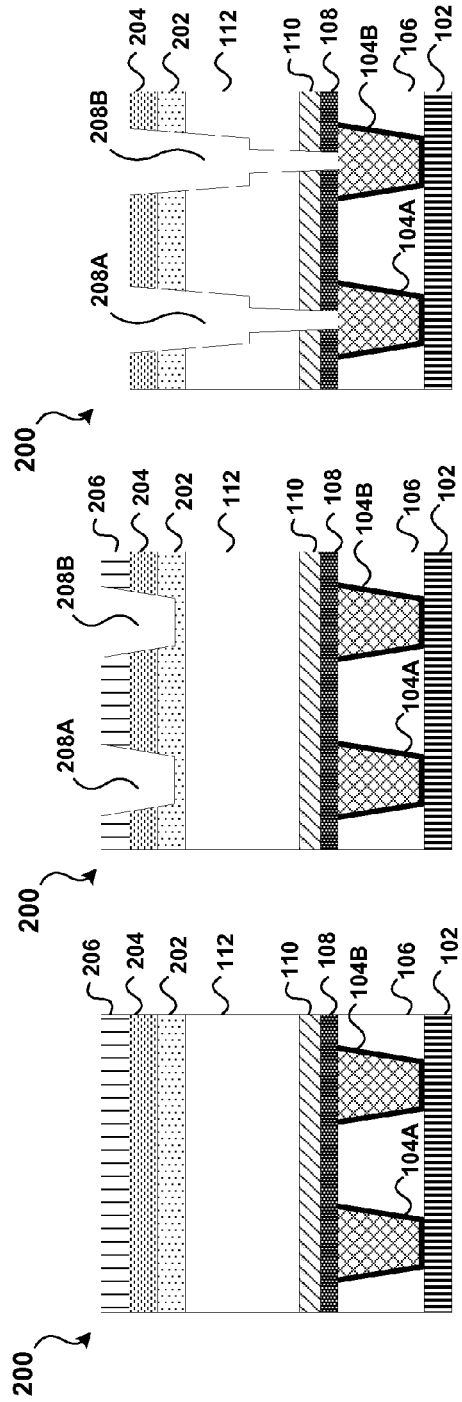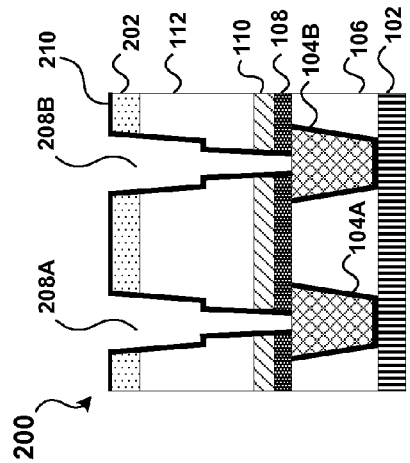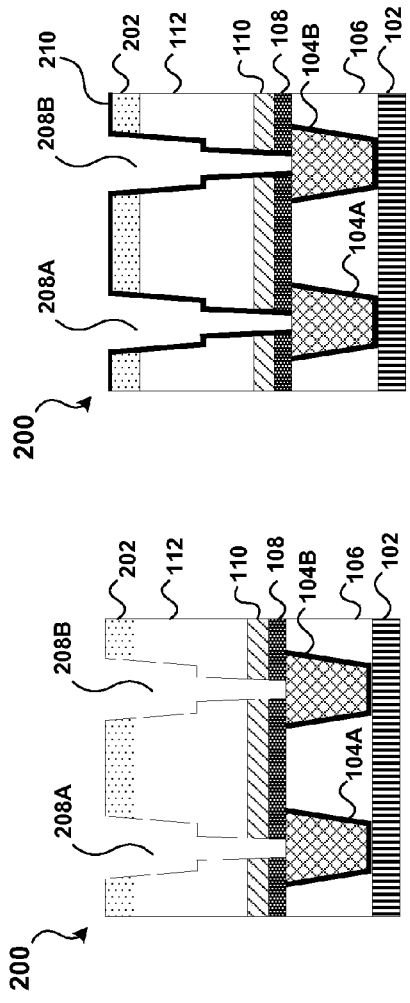

SYSTEM AND METHOD FOR CHEMICAL-MECHANICAL PLANARIZATION OF A METAL LAYER

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous problems have arisen. One problem of particular concern that has arisen is the increase in parasitic capacitance associated with vias through inter-metal dielectric layers made from silicon oxide. This has prompted a search for "low-k" dielectrics, dielectrics with a lower dielectric constant than silicon dioxide. Promising low-k materials have been developed to allow the long trend of scaling down feature size to continue. While many low-k materials show significant potential, many such materials have been problematic to integrate into existing, traditional semiconductor processes. For example, planarizing wafers that feature low-k dielectrics can present challenges that can result during the removal excess material during metallization steps. The challenges can cause increased resistance in associated vias.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIGS. 2A-2I are cross-sectional diagrams of a semiconductor substrate undergoing planarization according to another embodiment of the present disclosure.

Figure 1A:
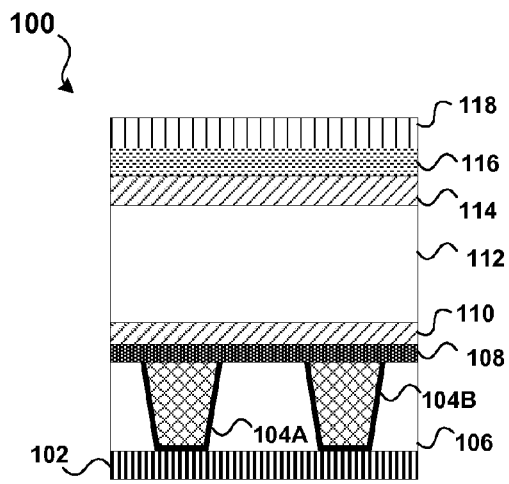
FIGS. 1A-1H are cross-sectional diagrams of a semiconductor substrate undergoing a planarization after a metal deposition step to form vias according to various embodiments of the present disclosure.

The various features disclosed in the drawings briefly described above will become more apparent to one of skill in the art upon reading the detailed description below. Where features depicted in the various figures are common between two or more figures, the same identifying numerals have been used for clarity of description. However, this should not be understood as limiting such features.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1B:
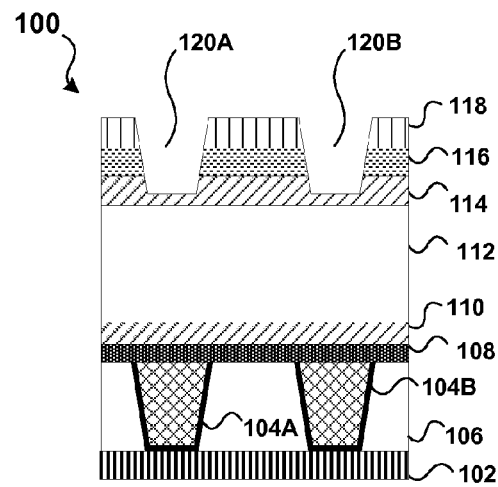
Figure 1C:
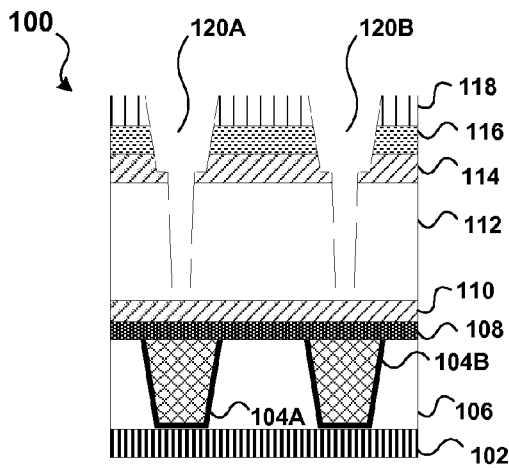
Figure 1D:
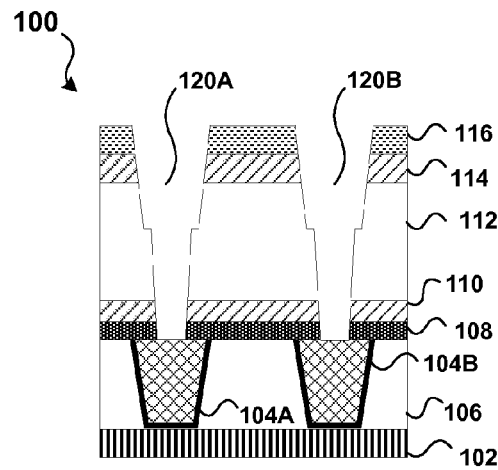
Figure 1E:
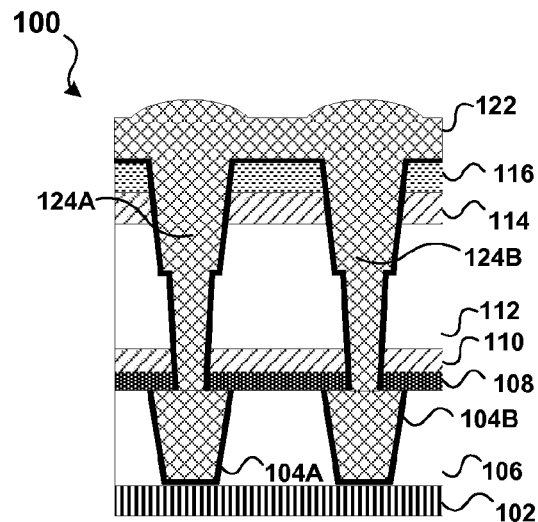
Figure 1F:
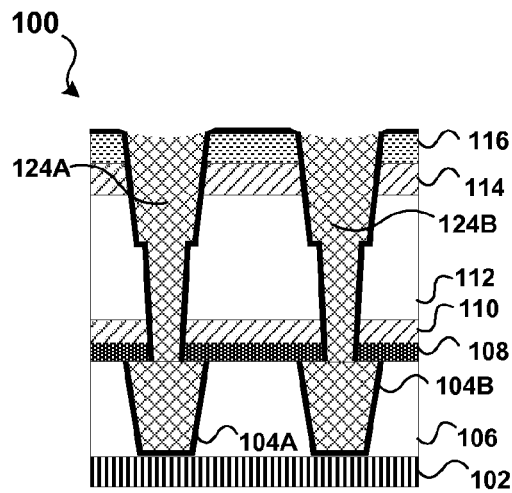
Figure 1G:
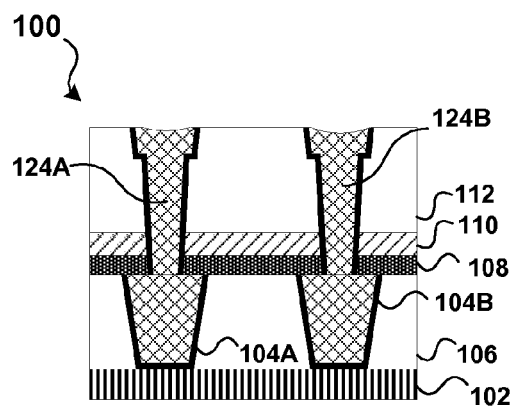
Figure 1H:
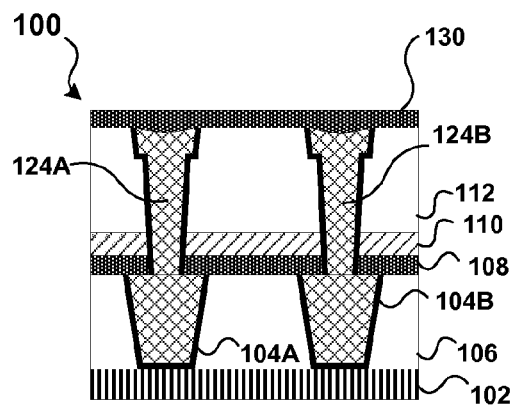

FIGS. 1A-1H present a series of fragmentary, cross-sectional diagrams of a semiconductor wafer 100 in various process stages by which a pair of vias are formed in a wafer that features a low-k inter-metal dielectric. The final figure in the series, FIG. 1H depicts an end result of the various processes. In FIGS. 1A-1H, a portion of wafer 100 is depicted, and other structures and processes may be formed or used on other portions of wafer 100 without departing from the scope of this disclosure.

FIG. 1A depicts a portion of wafer 100. Wafer 100 includes a substrate 102 upon which a plurality of layers are deposited. In the depicted embodiment, substrate 102 is a silicon substrate. Other embodiments may substrates formed from other suitable materials. Wafer 100 also includes a pair of metal plugs 104A and 104B. In the depicted embodiment, the metal plugs 104A and 104B are made from copper. Metal plugs 104A and 104B are laterally surrounded by a first low-k, inter-metal dielectric (IMD) layer 106. In the depicted embodiment, IMD layer 106 is formed from a low-k material. Above IMD layer 106, there is a hard mask layer 108 made of SiN. A number of planar layers are deposited over hard mask layer 108, including a first and a second tetraethly orthosilicate (TEOS) layer with a second low-k, IMD layer 112 situated in between. Thus a first TEOS layer 110 is located beneath IMD layer 112, and second TEOS layer 114 is situated over IMD layer 112. Each TEOS layer is an oxide layer formed using TEOS gas as a precursor. Above second TEOS layer 114 there is a TiN hard mask layer 116 and an anti-reflective coating (ARC) layer 118.

Various process steps may be used to form vias through the second IMD layer 112. These steps are depicted in FIGS. 1B through 1H. The spaces which are filled with metal to form vias may use multiple etch steps. The first such step is depicted in FIG. 1B in which spaces 120A and 120B are first formed by a dry etch process. The second step is depicted in FIG. 1C in which spaces 120A and 120B are deepened. Finally, as depicted in FIG. 1D, spaces 120A and 120B are deepened so as to reach the surface of metal plugs 104A and 104B, and may be expanded laterally to allow for thicker vias. This final etch may be a wet etch which also removes ARC layer 118.

In FIG. 1E, a copper layer 122 is deposited on the surface of wafer 100. The copper material is deposited so as to fill spaces 120A and 120B to create copper vias 124A and 124B. As depicted, a barrier layer 128 is deposited before the copper layer 122 is sputtered. Therefore it is situated above the planar surfaces of TiN hard mask 116 and also on the sidewalls of spaced 120A and 120B. The copper deposition process fills spaces 120A and 120B, but also leaves excess copper on the surface of wafer 100. Further processing of wafer 100 may include removing excess copper.

Thus, in FIG. 1F, a partial chemical-mechanical planarization (CMP) process is performed. This partial CMP process removes copper above the TiN hard mask layer 116, but substantially stops at that level. As depicted there may be some extra removal of copper from the tops of vias 124A and 124B due to the partial copper CMP process. Before wafer 100 is ready for the addition of other layers over it, the several additional layers are removed. These additional layers include barrier layer 128, TiN hard mask 116, second TEOS layer 114.

As depicted in FIG. 1G, these layers are removed by a barrier CMP process, which may have a higher particle concentration than the partial CMP. Due to the lack of reliable end-point detection for the barrier CMP process, timing may be used in an attempt to avoid excessive removal of material. Excess material removal can lead to a shorter trench, and can increase the resistance thereof. In order to avoid the excess removal, in-line measurements may be made to monitor the time allocated to the barrier CMP process for subsequently processed wafers.

Finally, in FIG. 1H, after the CMP processes are performed, a hard mask layer 130 is deposited over semiconductor wafer 100. This may be done to allow for subsequent patterning of metal layers located above hard mask layer 130, including additional vias.

Figure 2F:
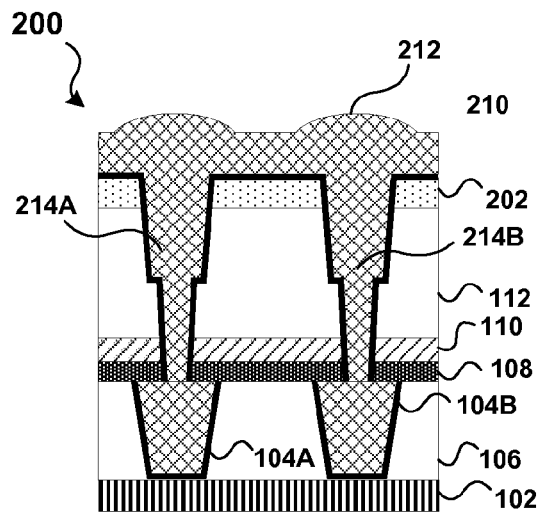
Figure 2G:
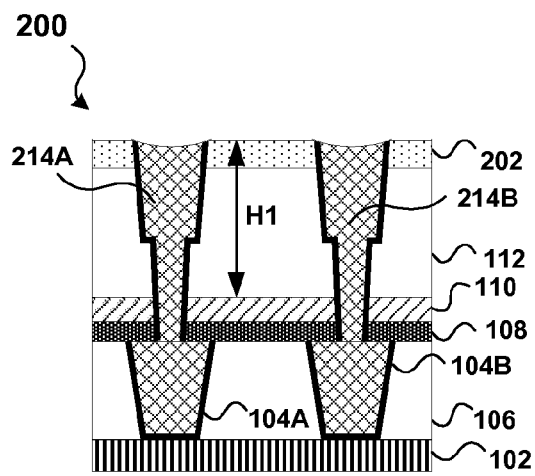
Figure 2H:
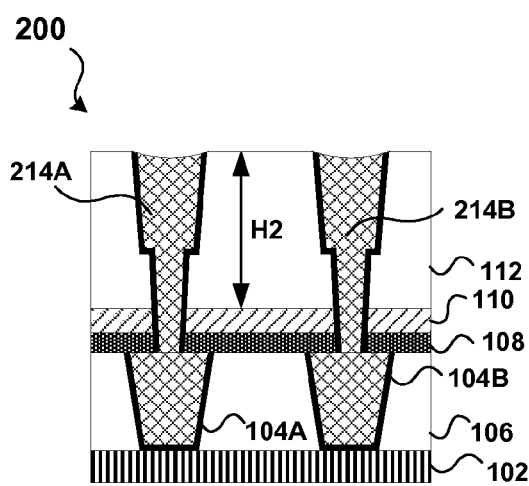
Figure 2I:
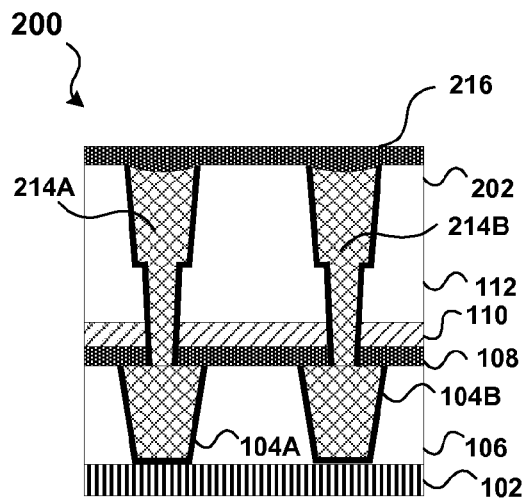

FIGS. 2A-2I also present a series of fragmentary, cross-sectional diagrams of a semiconductor wafer 200 in various process stages by which a pair of vias are formed in a wafer that features a low-k inter-metal dielectric. Many features of wafer 200 are similar to those of semiconductor wafer 100 of FIGS. 1A-1S. The final figure in the series, FIG. 2H depicts an end result of the various processes as will be described. In FIGS. 2A-2I, only a portion of wafer 200 is depicted, and other structures and processes may be formed or used on other portions of wafer 200 without departing from the scope of this disclosure.

FIG. 2A depicts wafer 200 before the formation of a number of vias. Wafer 200 includes a substrate 102. As depicted, substrate 102 is a silicon substrate. However, in other embodiments, substrate 102 may be a substrate formed from another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. While depicted as a single layer, substrate 102 may include a plurality of patterned and/or unpatterned materials layers that are not depicted.

Above substrate 102 there are two metal features: metal plug 104A and metal plug 104B. As depicted, metal plugs 104A and 104B are vias running through an IMD layer 106. In other embodiments, metal plugs 104A and 104B may by features of a metallization layer. In this embodiment, IMD layer 106 is a low-k dielectric layer made from XLK, an extra low-k material. In some embodiments, IMD layer 106 may have a dielectric constant lower than 2.4. In the depicted embodiment, IMD layer 106 is made using diethoxymethylsilane (mDEOS) as a precursor gas in a CVD process. However, other low-k dielectric materials may be used as well. There is a barrier layer between IMD layer 106 and metal plugs 104A and 104B. This barrier layer may be made of a self-formed metal oxide layer or a TaN layer. In some embodiments, no barrier layer is located between IMD layer 106 and metal plugs 104A and 104B.

A hard mask layer 108 is deposited over IMD layer 106 and the tops of metal plugs 104A and 104B. Overlying the hard mask layer 108 is a TEOS layer 110 and an additional IMD layer 112. Like IMD layer 106, in the depicted embodiment, IMD layer 112 is another low-k inter-metal dielectric layer formed from XLK or similar material. In other embodiments, IMD layer 112 may be another low-k dielectric layer, either porous or non-porous.

In many respects the aspects of wafer 200 described thus far are similar to those of wafer 100. However, instead of the TEOS layer 114 of wafer 100 as seen in FIG. 1A, wafer 200 includes an extra or extreme low-k dielectric (ELK) layer 202 disposed above IMD 112. As depicted ELK layer 202 is an $SiO_xC_yH_z$ (SiOCH) layer formed using diethoxymethylsilane (mDEOS) as a precursor gas in a CVD process. As depicted in FIG. 2A, the SiOCH layer is uncured, so ELK layer 202 may be referred to as uncured ELK layer 202. Other embodiments of uncured ELK layer 202 may include different ELK materials and precursor gases. Processes other than CVD may be used to deposit uncured ELK layer 202. During the formation of uncured ELK layer 202, porogenic compounds may be added to the layer. In the depicted embodiment, uncured ELK layer 202 is deposited along with alpha-terpinene (ATRP). In addition to or in place of ATRP, other embodiments of uncured ELK layer 202 may include 2,5-norbornadiene (NBDE), and other suitable porogens, compounds that facilitate the formation of pores within a material.

Wafer 200 also includes a hard mask layer 204 over uncured ELK layer 202. In the depicted embodiment, hard mask layer 204 is a TiN layer, though other materials may be used in other embodiments. Finally, wafer 200 also includes an anti-reflective coating (ARC) layer 206 overlying hard mask layer 204. In the depicted embodiment, ARC layer 206 is a silicon oxide layer. As will become apparent, wafer 200, with its material layers as described above, may facilitate planarization after a metallization process such as occur during via formation.

In FIG. 2B an etch process is performed to begin formation of vias through IMD layer 112. While not depicted, layer of photoresist (PR) is deposited and patterned to serve as a mask for an etch process that may remove portions of ARC layer 206, hard mask layer 204, and uncured ELK layer 202. This etch process is a gas-assisted etch that results in spaces for vias, including a space 208A and a space 208B as depicted.

In FIG. 2C an additional dry etch process is used to expand spaces 208A and 208B. A dry etch can be used to expand the spaces 208A and 208B down to the surface of metal plugs 104A and 104B without greatly increasing the lateral dimensions. In other embodiments other etches may be used. As depicted in FIG. 2C, a wet etch is used to remove hard mask layer 204 from the surface of ELK layer 202.

After the removal of hard mask layer 204, a barrier layer 210 is formed as depicted in FIG. 2E. Other embodiments do not contain a barrier layer 210. In embodiments that do contain barrier layer 210, barrier layer 210 may be formed from a variety of materials. For example, in the depicted embodiment, barrier layer 210 is a TaN layer about 10 to about 20 angstroms thick. In other embodiments, barrier layer 210 may be a self-formed metal oxide layer.

On top of barrier layer 210, a conductive, metal layer is deposited. As shown in FIG. 2F, this metal layer is a copper layer 212 deposited onto the surface of wafer 200 by a CVD process. The copper fills the spaces 208A and 208B to form vias 214A and 214B. In addition to spaces 208A and 208B, a copper layer is formed over the barrier layer 210. Approximately centered over each of vias 214A and 214B an overburdened area may appear after the deposition process as depicted. In other embodiments, other metals may be used to form vias 214A and 214B. Additionally, other processes such as e-beam evaporative deposition, physical vapor deposition, or electrochemical deposition may be used to deposit the metal layer.

After deposition of copper layer 212, the portion of copper layer 212 that doesn't form vias 214A and 214B is removed. This may be done by a CMP process, as depicted in FIG. 2G.

In the depicted embodiment, a CMP process is used to remove the portion of copper layer 212 above uncured ELK layer 202 using a single slurry in a single CMP process. This is distinct from the CMP processes used in FIGS. 1E and 1F, which each used a different slurry. Also, unlike the CMP processes used in connection with wafer 100, the single CMP process employed in fabricating wafer 200 includes a clear end-point detection. In the depicted embodiment, by measuring the eddy current through copper layer 212, a clear end-point can be detected, preventing excessive material removal by the CMP process.

In embodiments in which barrier layer 210 is a TaN layer, the CMP process can be continued for about 30 to about 50 additional seconds beyond the end-point detection to remove barrier layer 210. In general, in the CMP process removes copper layer 212 faster than barrier layer 210, which in turn is removed fast than uncured ELK layer 202. This helps prevent excessive removal of material. After the CMP process is complete, there is a height H1, measured from the top of TEOS layer 106 to the top of uncured ELK layer 202.

After the excess copper layer 212 has been removed and barrier layer 210 has been removed also by the same slurry and CMP process, the uncured ELK layer 202 is cured, as seen in FIG. 2H. After the curing process, the height H1 remains substantially the same, with cured ELK layer 202 becoming effectively a part of IMD layer 112. In the depicted embodiment, the ELK layer 202 is cured by using a thermal process, which includes exposure to a 400 degree Celsius environment with $N_2$ or $H_2$ for about 10 to about 60 seconds. The porogens are removed from ELK layer 202 in the curing process. In other embodiments, exposure to ultraviolet radiation may also be added to the thermal process.

Once ELK layer 202 has been cured, and effectively becomes part of low-k IMD layer 112, a hard mask layer 216 is deposited on the top of the augmented IMD layer 112 and the exposed copper vias 214A and 214B. Hard mask layer 216 is a SiN hard mask layer in the depicted embodiment, but may also be a SiC or other suitable hard mask layer in other embodiments. Hard mask layer 216 may serve as an etch stop for subsequent processing steps that are not pertinent to this disclosure.

Figure 3:
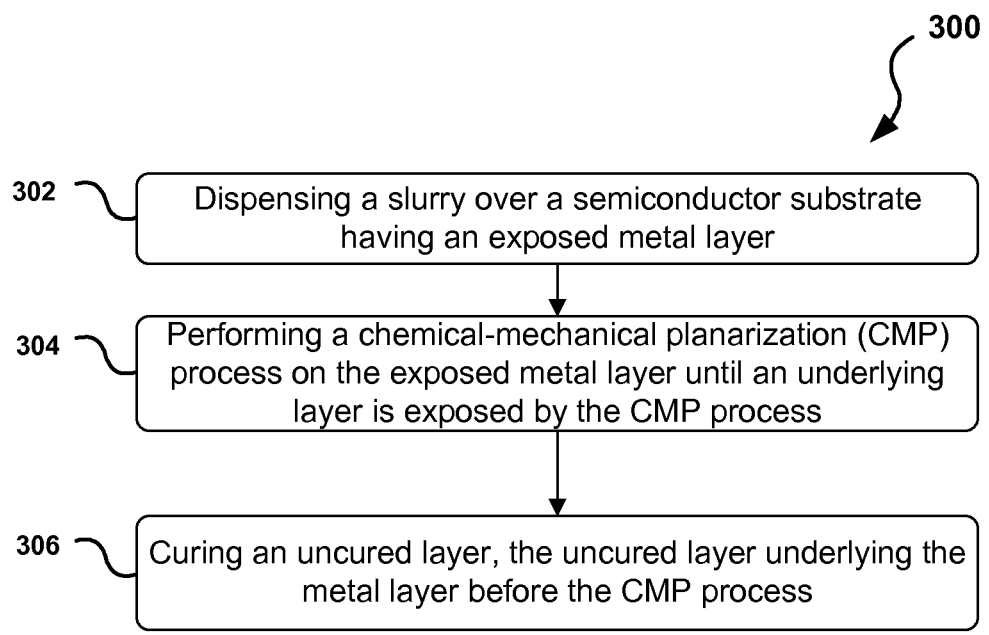
FIG. 3 is a flowchart of a method for planarizing a metal layer on a semiconductor substrate according to an embodiment.

FIG. 3 is a flowchart of a method 300 for planarizing a metal layer on a semiconductor substrate that features low-k inter-metal dielectric layers. The method may begin when a semiconductor processing tool dispenses a slurry over a semiconductor substrate having an exposed metal layer on top, in step 302. The slurry may be used in step 304 during a CMP process performed on the metal layer by a CMP tool, in step 304. The CMP process may continue until a layer underlying the metal layer is exposed. Thus the CMP process may remove a single layer from a plurality of layers on the semiconductor substrate. The method may continue in step 306, when the substrate is exposed to a curing process to cure an uncured layer that was underlying the metal layer before its removal.

A number of variations are included within the scope of method 300. To better describe method 300, reference will be made to FIGS. 2A-2I. Such references are for explanatory purposes and should not be understood as limiting. A semiconductor processing tool may be used to distribute a slurry to be used in a CMP process on top of the surface of copper layer 212 of FIG. 2F (step 302). The slurry contains abrasive particles to facilitate the removal of copper layer from the surface of wafer 200. Wafer 200, with the slurry on copper layer 212 is subjected to a CMP process in a CMP tool (step 304). The CMP tool is configured to use an electrical end-point detection mechanism. By measuring the eddy currents in the CMP tool, i.e. in situ, the CMP tool detects when copper layer 212 is removed by measuring a significant change in the eddy current signal, and thus when the CMP tool begins removing TaN barrier layer 210, which is about 10 to about 20 angstroms thick. The CMP tool can be programmed to continue the same CMP process with the same slurry for a predetermined number of seconds after the detection of the end-point, such as 35 seconds, to remove TaN barrier layer 210 completely. In embodiments in which there is no barrier layer, or the barrier layer made from a metal oxide, the CMP process may be stopped as soon as the end-point is detected. Thus, metal oxide barrier layer 210 may be left in place in some embodiments.

In general, the slurry and CMP process remove material faster from copper layer 212 than from barrier layer 210. Additionally, the slurry and CMP process remove material faster from barrier layer 210 than from uncured ELK layer 202. This may help prevent overpolishing that might remove material unnecessarily.

In the present example, steps 302 and 304 of method 300 result in a wafer 200 appearing as depicted in FIG. 2G. In FIG. 2G, after the CMP process removes copper layer 212, and potentially barrier layer 210 as well, the tops of vias 214A and 214B are exposed as is uncured ELK layer 202. ELK layer 202 is a curable layer made of SiOCH. ELK layer 202 contains porogens such as ATRP. In step 306, ELK layer 202 is cured by application of a thermal process. In this example, the thermal process with 400 degree Celsius temperatures in an $H_2$ environment for approximately 30 seconds is applied to ELK layer 202. The curing process removes the porogens from the SiOCH material, and may effectively make ELK layer 202 into a low-k layer and an extension of IMD layer 112 which underlies it.

Figure 4:
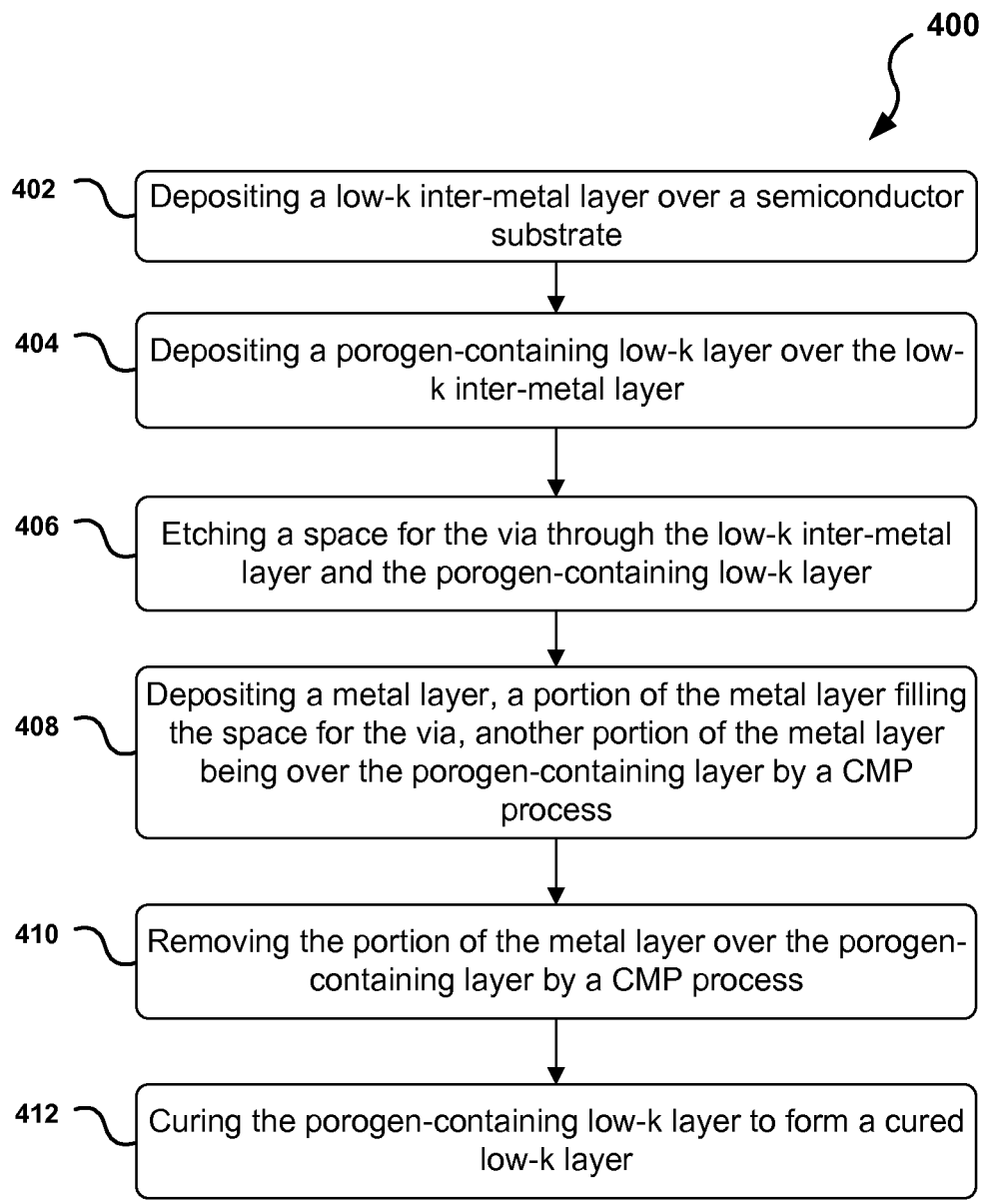
FIG. 4 is a flowchart of forming a via through a low-k inter-metal dielectric layer according to an embodiment.

FIG. 4 is a flowchart of a method 400 for forming a via through a low-k inter-metal dielectric layer. Method 400 begins in step 402 when a low-k inter-metal dielectric layer is deposited over a semiconductor substrate. The semiconductor substrate may already have a plurality of patterned and/or unpatterned material layers when the low-k inter-metal dielectric layer is deposited. In step 404, a porogen-containing low-k layer is deposited over the low-k inter-metal layer. The semiconductor substrate is subjected to one or more etch processes to etch a space for a via through the porogen-containing low-k layer and the low-k inter-metal layer, in step 406. In step 408, a metal layer is deposited on top of the semiconductor substrate. A portion of the metal layer fills up the space to form the via, while another portion of the metal layer is horizontally disposed on the surface of the semiconductor substrate. This latter portion of the metal layer is removed by a CMP process in step 410. After the removal of the CMP process, the porogen-containing low-k layer is cured using either a thermal process or an ultra-violet (UV) process, in step 412.

In order to better describe method 400, reference will now be made to wafer 200 as depicted in FIGS. 2A-2I. This example is offered to provide a clearer description of method 400, and is not to be understood as limiting the steps of method 400 to wafer 200. The CMP process uses a single step, with a single slurry. As discussed in FIG. 2A, a low-k IMD layer 112 is deposited over semiconductor substrate 102. In this example, a number of material layers, some patterned, some unpatterned are disposed in between the top surface of substrate 102 and the deposited low-k IMD layer 112. IMD layer 112 is deposited using a spin-on process to form a layer of hydrogen silsesquioxane resin (step 402). In other embodiments, IMD layer 112 may be deposited by a chemical vapor deposition (CVD) process.

A porogen-containing extreme low-k (ELK) layer 202 is then deposited over the IMD layer 112 (step 404). In this example, the ELK layer 202 is an SiOCH layer deposited using a CVD process with mDEOS as the precursor gas. Porogenic compounds, or porogens, are included in the layer. In this example, ATRP is included as the porogen, but other examples may include NDBE. In general applications, ELK layers are often cured immediately after deposition. However, no curing process is undertaken at this stage of method 400. After the deposition of the porogen-containing ELK layer 202, a hard mask layer 204 made of TiN may be deposited, in addition to a silicon oxide ARC layer 206 above the hard mask layer 204.

A photoresist layer may then be spun on and patterned to create a photo mask for etching. A number of individual etching steps are performed. For example, two dry etch processes are used to form a space 208A for a via as seen in FIGS. 2B and 2C (step 406). Subsequently, a wet etch is used to removing hard mask layer 204. Other etch processes may be used as known to one of skill in the art.

As depicted in FIG. 2E, in some embodiments a barrier layer 210 is deposited before step 408. This barrier layer can be a TaN layer from about 10 angstroms to about 20 angstroms thick and covers the sidewalls of space 214A as well as the surface of uncured ELK layer 202. In some embodiments, the barrier layer 210 is a self-formed metal oxide layer. However, unlike FIGS. 2E-2I, the present example does not include a barrier layer. In this example, metal layer 212 is a copper layer deposited by a CVD process (step 408). Other processes that may be used include evaporative deposition, sputtering, and forming a seed layer followed by electroplating. The copper layer 212 is deposited so as to fill the space 208A to form a via 214A as depicted in FIG. 2F. The deposition also results in a portion of copper layer on top of the wafer 200, overlying the ELK layer 202. This portion of copper layer 212 is to be removed.

A slurry suitable for polishing/removing copper is deposited by a CMP tool onto the copper layer 212. The CMP tool is used to perform a CMP process. The CMP process continues until copper layer 212 is removed, at which point the uncured ELK layer 202 is encountered by the CMP process (step 410). When this occurs an in situ end-point is detected as a change in an eddy current signal. Thus, uncured ELK layer 202 functions as an end-point detection layer. This can prevent damage to the low-k IMD layer 112. In embodiments that include a barrier layer 210, the barrier layer may be removed by extending the duration of the CMP process by a certain amount of time. The slurry and CMP process removes material from copper layer 212 faster than from barrier layer 210, which is removed faster than uncured ELK layer 202. Thus, for embodiments including barrier layer 210 and embodiments without barrier layer 210, uncured ELK layer 202 can serve as a CMP stop layer and can protect the underlying IMD layer 112.

After the removal of the portion of copper layer 212 that does not form part of via 214A, uncured ELK layer 202 is cured. In the present example, uncured ELK layer 202 is subjected to a thermal process at 400 degrees Celsius with $H_2$ as an ambient gas for about 30 seconds (step 412). This thermal process removes the porogens and creates a cured ELK layer 202. Alternatively, ultra-violet radiation may be used to cure uncured ELK layer 202.

Embodiments disclosed herein may allow a single CMP process to be used during via formation through low-k IMD layers rather than multiple CMP processes. This may decrease input costs and time during fabrication. The embodiments may also improve control of the CMP process by providing a CMP stop layer that can provide end-point detection. Further embodiments may reduce damage to the low-k IMD layer and decrease the intake of mobile copper ions during the CMP process.

One of the broader embodiments disclosed herein is a semiconductor wafer. That semiconductor wafer may include a semiconductor substrate. The substrate may have a plurality of material layers thereon, including a low-k layer, an uncured low-k layer over the low-k layer, and a metal layer over the uncured low-k layer. The metal layer may include a metal via extending through the uncured low-k layer and the low-k layer. Some embodiments also include a barrier layer disposed between the metal layer and metal via on one side of the barrier layer and the uncured low-k layer and low-k layer on another side of the barrier layer. The uncured low-k layer may be an $SiO_xC_yH_z$ layer, and may include a porogen that can be removed to cure the uncured low-k layer. The porogen may be alpha-terpinene and/or norbornadiene.

Another of the broader embodiments disclosed herein is a method for planarizing a metal layer, which may be copper, on a semiconductor substrate. The method may include dispensing a slurry over a semiconductor substrate having an exposed metal layer, performing a CMP process on the exposed metal layer until an underlying layer is exposed by the CMP process, and curing an uncured layer that underlies the metal layer before the CMP process.

Other embodiments of the method may include stopping the CMP process when an end point is detected in situ when the exposed metal layer is removed, the end point being detected as an eddy current signal. The slurry and CMP process may remove material faster from the metal layer than from an underlying barrier layer deposited over the uncured layer, and the slurry and CMP process may remove material faster from the underlying barrier layer than from the uncured layer. Curing the uncured layer may porogens from the uncured layer to form a low-k layer. Embodiments of the method may also include stopping the CMP process when an end point is detected in situ when the exposed metal layer and an underlying barrier layer are removed, the end point being detected as an eddy current signal.

Another of the broader embodiments disclosed herein is a method for forming a via through a low-k inter-metal dielectric layer. The method may include steps of depositing a low-k inter-metal layer over a semiconductor substrate, depositing a porogen-containing low-k layer over the low-k inter-metal layer, and etching a space for the via through the low-k inter-metal layer and the porogen-containing low-k layer. The method may further include depositing a metal layer, a portion of the metal layer filling the space for the via, another portion of the metal layer being over the porogen-containing low-layer, removing the portion of the metal layer over the porogen-containing layer by a CMP process, and curing the porogen-containing low-k layer to form a cured low-k layer.

Curing the porogen-containing low-k layer may include subjecting the porogen-containing low-k layer to a thermal process or ultra-violent radiation. Embodiments of the method may further include depositing a barrier layer before depositing the metal layer, the barrier layer covering sidewalls of the space for the via and a top surface of the porogen-containing low-k layer. The barrier layer may be a TaN layer, and may be removed by extending a duration of the CMP process. Depositing the porogen-containing low-k layer may include performing a chemical vapor deposition process to deposit an $SiO_xC_yH_z$ layer, which may contain alpha-terpenine.

In some embodiments of the method, removing the portion of the metal layer over the porogen-containing layer by a CMP process may include applying a slurry solution over the metal layer, using a CMP tool to remove material, and stopping the CMP process when an end point is detected. The end point may be determined by measuring an eddy current and may indicate that all of the metal layer located above the porogen-containing low-k layer has been removed.

Numerous variations may be made to the embodiments discussed herein that may be apparent to one of skill in the art. These variations are considered to be within the scope and spirit of this disclosure.

What is claimed is:

1. A method for planarizing a metal layer on a semiconductor substrate, the method comprising:
   dispensing a slurry over a semiconductor substrate having an exposed metal layer;
   performing a chemical-mechanical planarization (CMP) process on the exposed metal layer, wherein the CMP process is programmed to continue for a duration after an eddy current signal is detected in situ; and
   curing an uncured layer, the uncured layer underlying the exposed metal layer before the CMP process.

2. The method of claim 1, wherein the semiconductor substrate includes a barrier layer between the uncured layer and the exposed metal layer, and wherein the duration is sufficient for the CMP process to remove the barrier layer.

3. The method of claim 1, wherein the slurry and CMP process remove material faster from the exposed metal layer than from an underlying barrier layer deposited over the uncured layer, and the slurry and CMP process remove material faster from the underlying barrier layer than from the uncured layer.

4. The method of claim 1, wherein the curing the uncured layer removes porogens from the uncured layer to form a low-k layer.

5. The method of claim 4, wherein the low-k layer becomes effectively a part of another low-k inter-metal dielectric layer underlying the low-k layer.

6. The method of claim 1, wherein the exposed metal layer is a copper layer.

7. The method of claim 1, wherein the uncured layer includes a porogen-containing low-k layer.

8. The method of claim 7, wherein the curing of the uncured layer includes subjecting the porogen-containing low-k layer to a thermal process or an ultra-violet radiation.

9. A method for forming a via through a low-k inter-metal dielectric layer, the method comprising:
   depositing a low-k inter-metal layer over a semiconductor substrate;
   depositing a porogen-containing low-k layer over the low-k inter-metal layer;
   forming a hard mask layer over the porogen-containing low-k layer;
   forming an anti-reflective coating (ARC) layer over the hard mask layer;
   etching a space for a via through at least the ARC layer, the hard mask layer, the porogen-containing low-k layer, and the low-k inter-metal layer;
   removing the ARC layer;
   after the removing of the ARC layer, removing the hard mask layer by another etching process;
   thereafter, depositing a metal layer in the space for the via and over the porogen-containing low-k layer;
   removing a portion of the metal layer by a chemical-mechanical planarization (CMP) process thereby exposing the porogen-containing low-k layer; and
   curing the porogen-containing low-k layer to form a cured low-k layer, wherein the cured low-k layer becomes effectively a part of the low-k inter-metal layer.

10. The method of claim 9, wherein the curing the porogen-containing low-k layer comprises subjecting the porogen-containing low-k layer to a thermal process or an ultra-violet radiation.

11. The method of claim 9, further comprising depositing a barrier layer before depositing the metal layer, the barrier layer covering sidewalls of the space for the via and a top surface of the porogen-containing low-k layer.

12. The method of claim 11, wherein the barrier layer is a TaN layer, and further comprising removing the barrier layer covering the top surface of the porogen-containing low-k layer by extending a duration of the CMP process.

13. The method of claim 9, wherein the depositing the porogen-containing low-k layer comprises performing a chemical vapor deposition process to deposit an $SiO_xC_yH_z$ layer.

14. The method of claim 13, wherein the $SiO_xC_yH_z$ layer contains alpha-terpenine.

15. The method of claim 9, wherein the removing the portion of the metal layer by a CMP process comprises:
   applying a slurry solution over the metal layer;
   using a CMP tool to remove material;
   stopping the CMP process when an end point is detected.

16. The method of claim 15, wherein the end point is determined by measuring an eddy current and indicating that the metal layer located above the porogen-containing low-k layer has been removed.

17. The method of claim 9, wherein the removing the hard mask layer uses a wet etch process.

18. A method comprising:
   receiving a semiconductor substrate;
   depositing a low-k inter-metal dielectric (IMD) layer over the semiconductor substrate;
   depositing a porogen-containing low-k dielectric layer over the low-k IMD layer;
   forming a hard mask layer over the porogen-containing low-k dielectric layer;
   forming an anti-reflective coating (ARC) layer over the hard mask layer;
   etching a space for a via through at least the ARC layer, the hard mask layer, the porogen-containing low-k dielectric layer, and the low-k IMD layer;
   removing the ARC layer;
   after the removing of the ARC layer, removing the hard mask layer by another etching process;
   thereafter, depositing a barrier layer, the barrier layer covering sidewalls of the space for the via and a top surface of the porogen-containing low-k dielectric layer;
   depositing a metal layer in the space for the via and over the barrier layer;
   performing a chemical-mechanical planarization (CMP) process to the metal layer, wherein the CMP process is programmed to extend for a duration after an end point is detected in situ thereby exposing the porogen-containing low-k dielectric layer; and
   curing the porogen-containing low-k dielectric layer to form a cured low-k dielectric layer, wherein the cured low-k dielectric layer becomes effectively a part of the low-k IMD layer.

19. The method of claim 18, wherein the end point is detected by measuring an eddy current.

20. The method of claim 18, wherein the curing the porogen-containing low-k dielectric layer is by a thermal process in an environment filled with $N_2$.

* * * * *